(12) United States Patent
Wu

(10) Patent No.: US 12,068,740 B2
(45) Date of Patent: Aug. 20, 2024

(54) BOOTSTRAPPED SWITCH

(71) Applicant: REALTEK SEMICONDUCTOR CORPORATION, Hsinchu (TW)

(72) Inventor: Yen-Ting Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 18/226,278

(22) Filed: Jul. 26, 2023

(65) Prior Publication Data

US 2023/0370054 A1 Nov. 16, 2023

Related U.S. Application Data

(62) Division of application No. 17/857,567, filed on Jul. 5, 2022, now Pat. No. 11,757,440.

(30) Foreign Application Priority Data

Sep. 23, 2021 (TW) .................................. 110135351

(51) Int. Cl.
*H03K 17/687* (2006.01)
*H03K 17/04* (2006.01)
*H03K 19/01* (2006.01)

(52) U.S. Cl.
CPC ............. *H03K 17/04* (2013.01); *H03K 19/01* (2013.01)

(58) Field of Classification Search
CPC .................. H03K 17/04; H03K 17/041; H03K 17/04106; H03K 17/06; H03K 17/063; H03K 17/10; H03K 17/102; H03K 17/12; H03K 17/122; H03K 17/14; H03K 17/145; H03K 17/16; H03K 17/161; H03K 17/162; H03K 17/687; H03K 17/6871; H03K 17/6872; H03K 19/01; H03K 19/017; H03K 19/01707; H03K 19/01714;

(Continued)

(56) References Cited

U.S. PATENT DOCUMENTS 7,274,222 B2 * 9/2007 Alacoque ............. H03K 17/165
327/427
11,070,207 B2 7/2021 Huang
(Continued)

FOREIGN PATENT DOCUMENTS

TW 202116019 A 4/2021

*Primary Examiner* — Long Nguyen
(74) *Attorney, Agent, or Firm* — WPAT, P.C

(57) ABSTRACT

A bootstrapped switch includes a first transistor, a second transistor, a first capacitor, three switches, and a switch circuit. The switch circuit includes a first switch, a second switch, a third switch, a fourth switch, a fifth switch, a sixth switch, and a second capacitor. The first transistor receives the input voltage and outputs the output voltage. The first terminal of the second transistor receives the input voltage, and the second terminal of the second transistor is coupled to the first capacitor. The control terminal of the first switch receives a clock. The second switch is coupled between the control terminal of the first transistor and the first switch. The second capacitor is coupled to a reference voltage through the third switch and the sixth switch, coupled to the input voltage through the fifth switch, and coupled to the control terminal of the first transistor through the fourth switch.

6 Claims, 5 Drawing Sheets

(58) Field of Classification Search
CPC ....... H03K 19/01728; H03K 19/01735; H03K 4/24; H03K 4/58
See application file for complete search history.

(56) References Cited

U.S. PATENT DOCUMENTS

| | | | |
|---|---|---|---|
| 11,757,440 B2 * | 9/2023 | Wu | H03K 17/0822 327/374 |
| 2006/0202736 A1 | 9/2006 | Aksin et al. | |
| 2021/0105014 A1 | 4/2021 | Huang | |

* cited by examiner

BOOTSTRAPPED SWITCH

CROSS REFERENCE TO RELATED APPLICATION

This application is a divisional application of U.S. application Ser. No. 17/857,567, filed on Jul. 5, 2022, now U.S. Pat. No. 11,757,440. This application claims the priority benefit of Taiwan Patent Application Serial Number 110135351, filed on Sep. 23, 2021, the full disclosure of which is incorporated herein by reference.

BACKGROUND OF THE INVENTION

1. Field of the Invention

The present invention generally relates to bootstrapped switches, and, more particularly, to bootstrapped switches that are turned on and off rapidly.

2. Description of Related Art

FIG. 1 is a circuit diagram of a conventional bootstrapped switch. The bootstrapped switch 10 includes a switch 101, a switch 102, a switch 103, a switch 104, a switch 105, and an N-channel metal-oxide-semiconductor field-effect transistor (N-channel MOSFET, hereinafter referred to as NMOS transistor) 106, and a bootstrap capacitor 107. The input terminal VI and the output terminal VO of the bootstrapped switch 10 are respectively coupled to the source and drain of the NMOS transistor 106. The gate of the NMOS transistor 106 is coupled to the voltage source V3 through the switch 105 as well as coupled to one terminal of the bootstrap capacitor 107 and one terminal of the switch 101 through the switch 104. The other terminal of the switch 101 is coupled to the voltage source V1. The other terminal of the bootstrap capacitor 107 is coupled to the voltage source V2 through the switch 102 and coupled to the source of the NMOS transistor 106 and the input terminal VI of the bootstrapped switch 10 through the switch 103. The voltage source V1 is at the high voltage level VDD, while the voltage source V2 and the voltage source V3 are at the ground level. The operation of the bootstrapped switch 10 is known to people having ordinary skill in the art and thus omitted for brevity.

The state of the switch 105 (being turned on or off) determines the state of the NMOS transistor 106 (being turned on or off). In other words, when a response time of the switch 105 is shorter (i.e., the gate of the NMOS transistor 106 is driven to reach the target voltage faster), the state of the NMOS transistor 106 is more in line with the system clock, which means that the bootstrapped switch 10 performs better (e.g., operating faster and generating more accurate samplings). In other words, the design of the switch 105 is crucial to the performance of the bootstrapped switch 10.

SUMMARY OF THE INVENTION

In view of the issues of the prior art, an object of the present invention is to provide bootstrapped switches, so as to make an improvement to the prior art.

According to one aspect of the present invention, a bootstrapped switch that receives an input voltage and outputs an output voltage is provided. The bootstrapped switch includes a first transistor, a first capacitor, a second transistor, a first switch, a second switch, a third switch, a fourth switch, a fifth switch, an inverter circuit, and a second capacitor. The first transistor has a first terminal, a second terminal, and a first control terminal. The first transistor receives the input voltage at the first terminal and outputs the output voltage at the second terminal. The first capacitor has a third terminal and a fourth terminal. The second transistor has a fifth terminal, a sixth terminal, and a second control terminal. The second transistor receives the input voltage at the fifth terminal. The sixth terminal is electrically connected to the third terminal of the first capacitor. The second control terminal is electrically connected to the first control terminal of the first transistor. The first switch is coupled between the third terminal of the first capacitor and a first reference voltage. The second switch is coupled between the fourth terminal of the first capacitor and a second reference voltage. The third switch is coupled between the fourth terminal of the first capacitor and the first control terminal of the first transistor. The fourth switch has a third control terminal and is coupled to the first reference voltage. The fifth switch is coupled between the first control terminal of the first transistor and the fourth switch. The inverter circuit has an input terminal and an output terminal. The input terminal is coupled to the third control terminal of the fourth switch, and the inverter circuit inverts a voltage at the third control terminal. The second capacitor has a seventh terminal and an eighth terminal. The seventh terminal is coupled to the output terminal of the inverter circuit, and the eighth terminal is coupled to the first control terminal.

According to another aspect of the present invention, a bootstrapped switch that receives an input voltage and outputs an output voltage is provided. The bootstrapped switch includes a first transistor, a first capacitor, a second transistor, a first switch, a second switch, a third switch, a fourth switch, a fifth switch, a sixth switch, a seventh switch, an eighth switch, a ninth switch, and a second capacitor. The first transistor has a first terminal, a second terminal, and a first control terminal. The first transistor receives the input voltage at the first terminal and outputs the output voltage at the second terminal. The first capacitor has a third terminal and a fourth terminal. The second transistor has a fifth terminal, a sixth terminal, and a second control terminal. The second transistor receives the input voltage at the fifth terminal. The sixth terminal is electrically connected to the third terminal of the first capacitor. The second control terminal is electrically connected to the first control terminal of the first transistor. The first switch is coupled between the third terminal of the first capacitor and a first reference voltage. The second switch is coupled between the fourth terminal of the first capacitor and a second reference voltage. The third switch is coupled between the fourth terminal of the first capacitor and the first control terminal of the first transistor. The fourth switch has a third control terminal and is coupled to the first reference voltage. The fifth switch is coupled between the first control terminal of the first transistor and the fourth switch. The second capacitor has a seventh terminal and an eighth terminal. The seventh terminal is coupled to the first reference voltage through the sixth switch and coupled to the first control terminal through the seventh switch. The eighth terminal receives the input voltage through the eighth switch and is coupled to the first reference voltage through the ninth switch. The sixth switch and the seventh switch are not turned on at the same time, and the eighth switch and the ninth switch are not turned on at the same time.

The bootstrapped switches of the present invention establishes a rapid turned-on and/or turn-off. In comparison with the prior art, the bootstrapped switches of the present invention can operate at a higher speed.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes bootstrapped switches. On account of that some or all elements of the bootstrapped switches could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
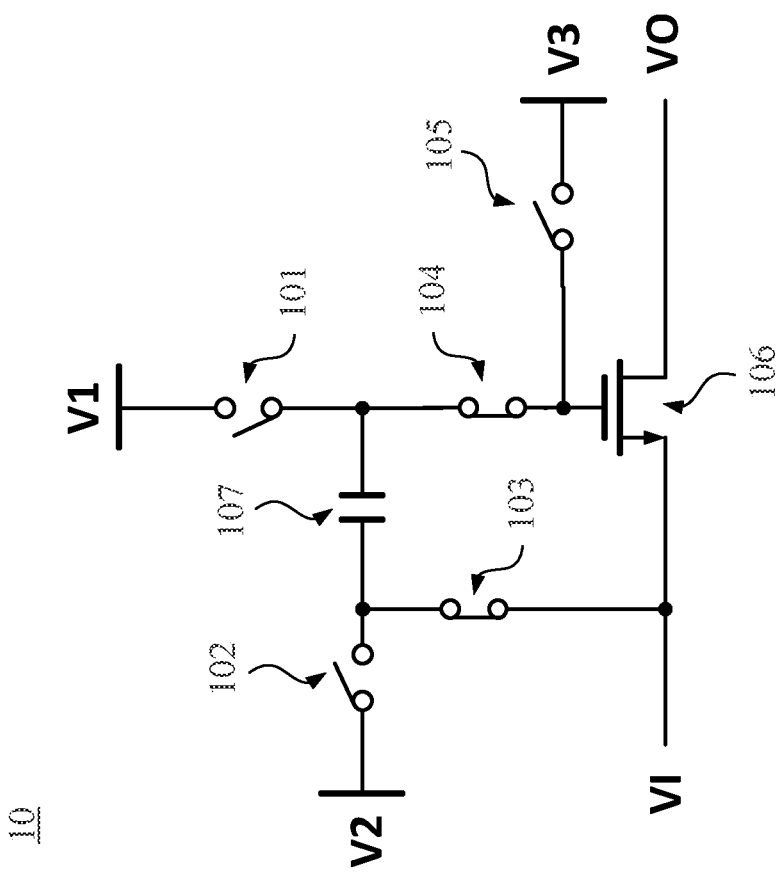
FIG. 1 is a circuit diagram of a conventional bootstrapped switch.
Figure 2:
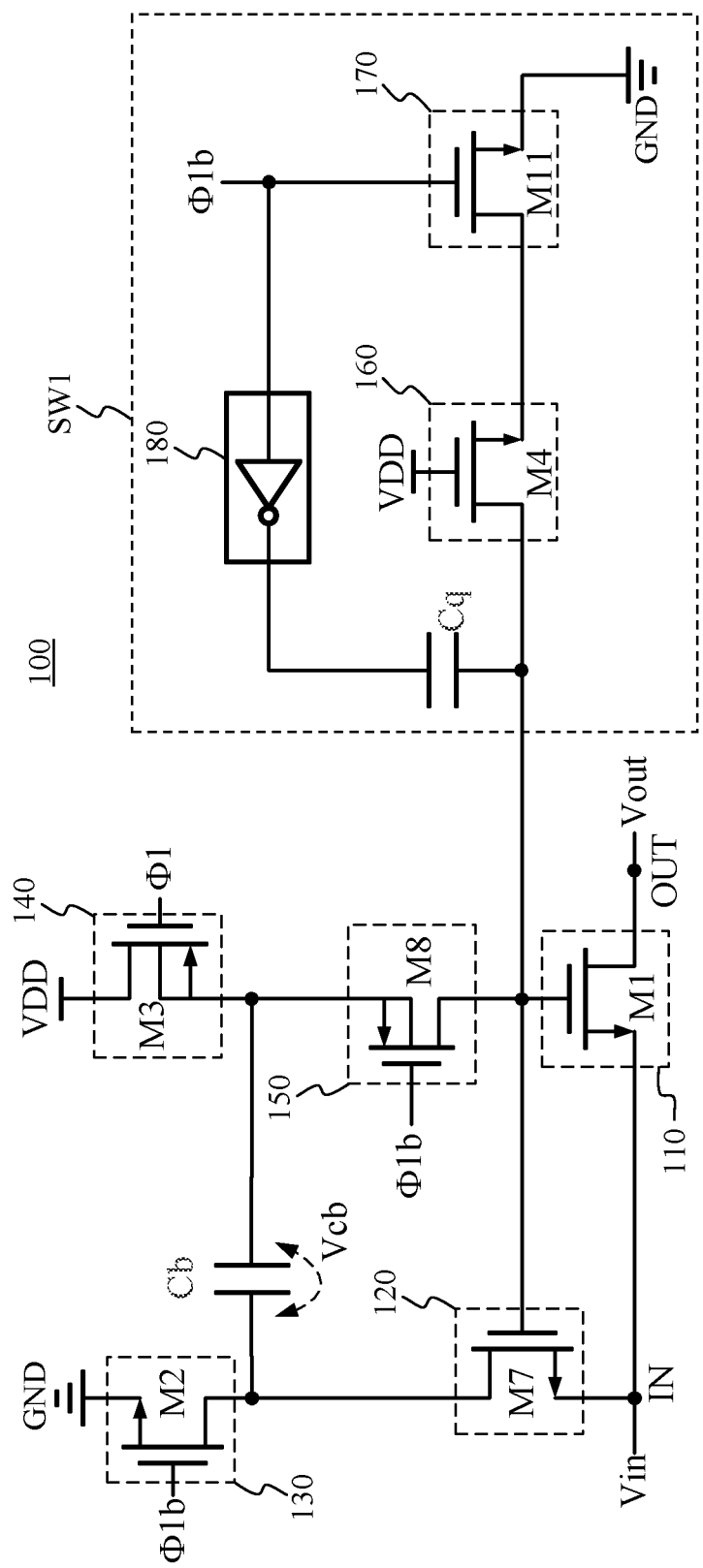
FIG. 2 is a circuit diagram of a bootstrapped switch according to an embodiment of the present invention.

FIG. 2 is a circuit diagram of a bootstrapped switch according to an embodiment of the present invention. The bootstrapped switch 100 receives the input voltage Vin at the input terminal IN, and outputs the output voltage Vout at the output terminal OUT. The bootstrapped switch 100 includes a switch 110, a switch 120, a switch 130, a switch 140, a switch 150, a switch 160, a switch 170, a bootstrap capacitor Cb, a capacitor Cq, and an inverter circuit 180. The switch circuit SW1 corresponds to the switch 105 of FIG. 1. The switch 110, the switch 120, the switch 130, the switch 140, the switch 150, the switch 160, and the switch 170 can be respectively embodied by a transistor M1, a transistor M7, a transistor M2, a transistor M3, a transistor M8, a transistor M4, and a transistor M11. Each transistor has a first terminal, a second terminal, and a control terminal, and the first terminal and the second terminal are two terminals of a switch embodied by the transistor. For Metal-Oxide-Semiconductor Field-Effect Transistors (MOSFETs), the first terminal can be one of the source and the drain, the second terminal can be the other of the source and the drain, and the control terminal is the gate. For bipolar junction transistors (BJTs), the first terminal can be one of the collector and the emitter, the second terminal can be the other of the collector and the emitter, and the control terminal is the base.

As shown in FIG. 2, the control terminal of the transistor M1 and the control terminal of the transistor M7 are electrically connected to each other. The transistor M1 receives the input voltage Vin at its first terminal, and outputs the output voltage Vout at its second terminal. The first terminal of the transistor M7 receives the input voltage Vin, and the second terminal of the transistor M7 is electrically connected to the first terminal of the bootstrap capacitor Cb. The first terminal of the transistor M2 is coupled to the first terminal of the bootstrap capacitor Cb, and the second terminal of the transistor M2 is coupled to the first reference voltage (the ground level GND in the example of FIG. 2). The first terminal of the transistor M3 is coupled to the second reference voltage (the power supply voltage VDD in the example of FIG. 2, which is higher than the ground level GND), and the second terminal of the transistor M3 is coupled to the second terminal of the bootstrap capacitor Cb. The first terminal of the transistor M8 is coupled to the control terminal of the transistor M1, and the second terminal of the transistor M8 is coupled to the second terminal of the bootstrap capacitor Cb. The first terminal of the transistor M4 is coupled or electrically connected to the control terminal of the transistor M1 and the control terminal of the transistor M7, and the control terminal of the transistor M4 is coupled or electrically connected to the power supply voltage VDD. The first terminal of the transistor M11 is coupled to the second terminal of the transistor M4, and the second terminal of the transistor M11 is coupled or electrically connected to the first reference voltage (the ground level GND). The control terminal of the transistor M11 receives the clock Φ1*b*. The first terminal of the capacitor Cq is coupled or electrically connected to the control terminal of the transistor M1. The input terminal of the inverter circuit 180 receives the clock Φ1*b*, and the output terminal of the inverter circuit 180 is coupled or electrically connected to the second terminal of the capacitor Cq.

Figure 3:
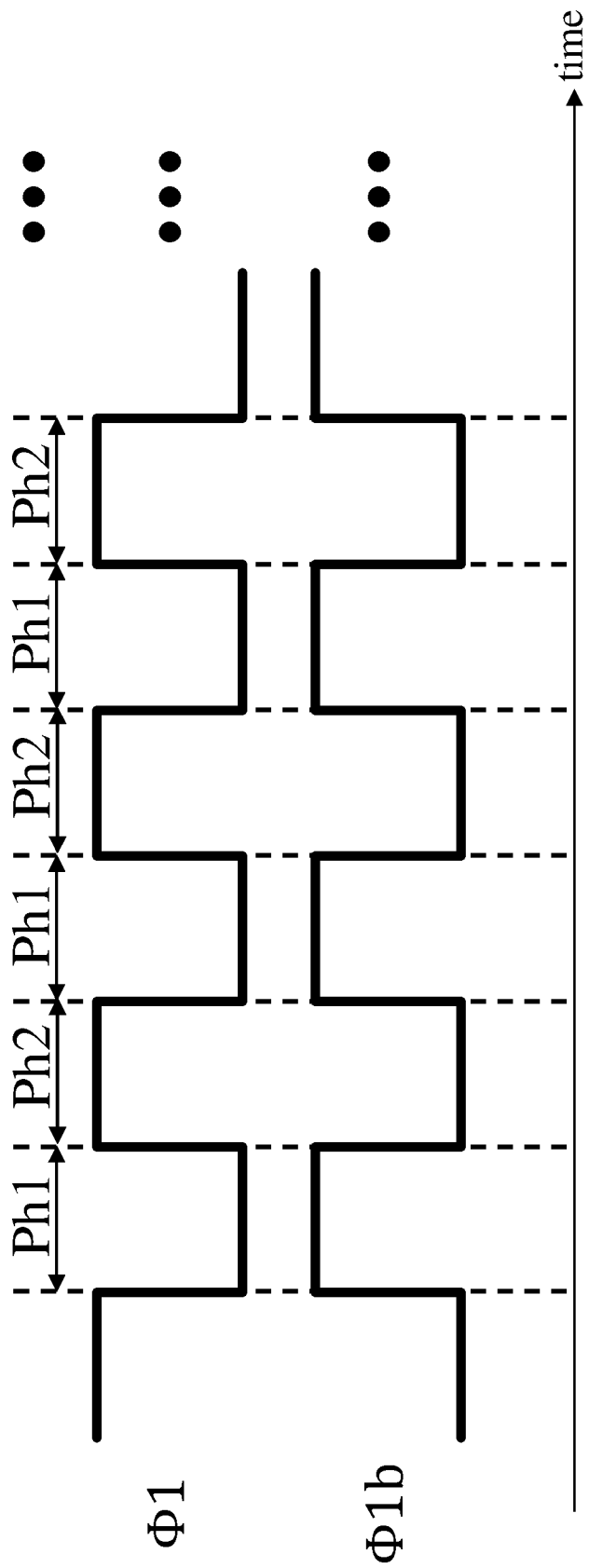
FIG. 3 shows an example of clock Φ1 and clock Φ1*b*.

The switch 130, the switch 140, the switch 150, and the switch 170 are turned on (the corresponding transistor is turned on) or off (the corresponding transistor is turned off) according to the clock Φ1 and the clock Φ1*b*. FIG. 3 shows an example of the clock Φ1 and the clock Φ1*b*, which are each other's inverted signal. Controlled by the clock Φ1 and the clock Φ1*b*, the bootstrapped switch 100 operates alternately in the first clock phase Ph1 (the period when the clock Φ1 is at the first level (e.g., the low level) and the clock Φ1*b* is at the second level (e.g., the high level)) and the second clock phase Ph2 (the period when the clock Φ1 is at the second level and the clock Φ1*b* is at the first level). The operational details of the bootstrapped switch 100 are discussed below.

Reference is made to FIGS. 2 and 3. In the first clock phase Ph1 (when the clock Φ1 is at the low level and the clock Φ1*b* is at the high level), the switch 130, the switch 140, the switch 160, and the switch 170 are turned on, and the switch 150 is turned off. When the switch 160 and the switch 170 are turned on, the voltage at the control terminal of the transistor M1 and the control terminal of the transistor M7 is substantially equal to the first reference voltage (the ground level GND), driving the switch 110 and the switch 120 to be off; in other words, the switch 110 and the switch 120 are turned off in the first clock phase Ph1. When the switch 130 and the switch 140 are turned on, the voltages at the two terminals of the bootstrap capacitor Cb are substantially the first reference voltage (the ground level GND) and the second reference voltage (the power supply voltage VDD), respectively; in other words, the bootstrap capacitor Cb charges in the first clock phase Ph1, and the voltage Vcb across the bootstrap capacitor Cb after the first clock phase Ph1 ends is substantially equal to the voltage difference between the first reference voltage and the second reference voltage.

In the second clock phase Ph2 (when the clock Φ1 is at the high level and the clock Φ1b is at the low level), the switch 130, the switch 140, the switch 160, and the switch 170 are turned off, and the switch 150 is turned on. When the switch 150 is turned on, the electric potential at the control terminals of the transistor M1 and the transistor M7 is substantially equal to the electric potential at the second terminal of the bootstrap capacitor Cb; as a result, the transistor M1 and the transistor M7 are turned on due to the voltage Vcb across the bootstrap capacitor Cb. When the transistor M7 is turned on, the voltage at the second terminal of the bootstrap capacitor Cb and the control terminal of the transistor M1 is substantially equal to the sum of the input voltage Vin and the voltage Vcb across the bootstrap capacitor Cb. When the transistor M1 is turned on, the output voltage Vout is substantially equal to the input voltage Vin; namely, the bootstrapped switch 100 is turned on.

The voltage at the control terminal of the transistor M1 may be greater than the power supply voltage VDD (even close to twice the power supply voltage VDD). One of the purposes of the transistor M4 is to separate the control terminal of the transistor M1 and the transistor M11 to prevent the first terminal of the transistor M11 from being subjected to this high voltage. Because the control terminal of the transistor M4 is coupled or electrically connected to the power supply voltage VDD, the transistor M4 can withstand this high voltage. Unfortunately, the transistor M4 slows down the voltage transition (from the second level (e.g., the high level) to the first level (e.g., the low level)) at the control terminal of the transistor M1, hindering the bootstrapped switch 100 from being immediately turned off after entering the first clock phase Ph1. In other words, the transistor M4 may decrease the switching speed of the bootstrapped switch 100.

One of the purposes of the capacitor Cq and the inverter circuit 180 is to rapidly pull up or pull down the voltage at the control terminal of the transistor M1 to increase the voltage transition speed at the control terminal of the transistor M1 (i.e., to boost the switching speed of the bootstrapped switch 100).

When the clock Φ1b transitions from the first level to the second level (the transistor M11 starts to be turned on but has not yet been completely turned on), the inverter circuit 180 outputs an output signal that is an inverted signal of the clock Φ1b (i.e., the output signal is a signal of the first level), and then the output signal is coupled to the control terminal of the transistor M1 through the capacitor Cq. As a result, the voltage at the control terminal of the transistor M1 may start to decrease before the transistor M11 and the transistor M4 are completely turned on. In other words, the inverter circuit 180 and the capacitor Cq are helpful in the rapid decrease of the voltage at the control terminal of the transistor M1 (i.e., increasing the turn-off speed the bootstrapped switch 100).

When the clock Φ1b transitions from the second level to the first level (the transistor M11 starts to be turned off but has not yet been completely turned off), the inverter circuit 180 outputs an output signal that is an inverted signal of the clock Φ1b (i.e., the output signal is a signal of the second level), and then the output signal is coupled to the control terminal of the transistor M1 through the capacitor Cq. As a result, the voltage at the control terminal of the transistor M1 may start to rise before the transistor M11 and the transistor M4 are completely turned off. In other words, the inverter circuit 180 and the capacitor Cq are helpful in the rapid increase of the voltage at the control terminal of the transistor M1 (i.e., increasing the turn-on speed of the bootstrapped switch 100).

To sum up, the inverter circuit 180 and the capacitor Cq are helpful in the early rise or fall of the voltage at the control terminal of the transistor M1, so that the bootstrapped switch has a more rapid response speed (i.e., can operate at a higher speed).

In some embodiments, the inverter circuit 180 includes an odd number of inverters, and the capacitance value of the capacitor Cq may be approximately one to two tenths of the capacitance value of the bootstrap capacitor Cb.

Figure 4:
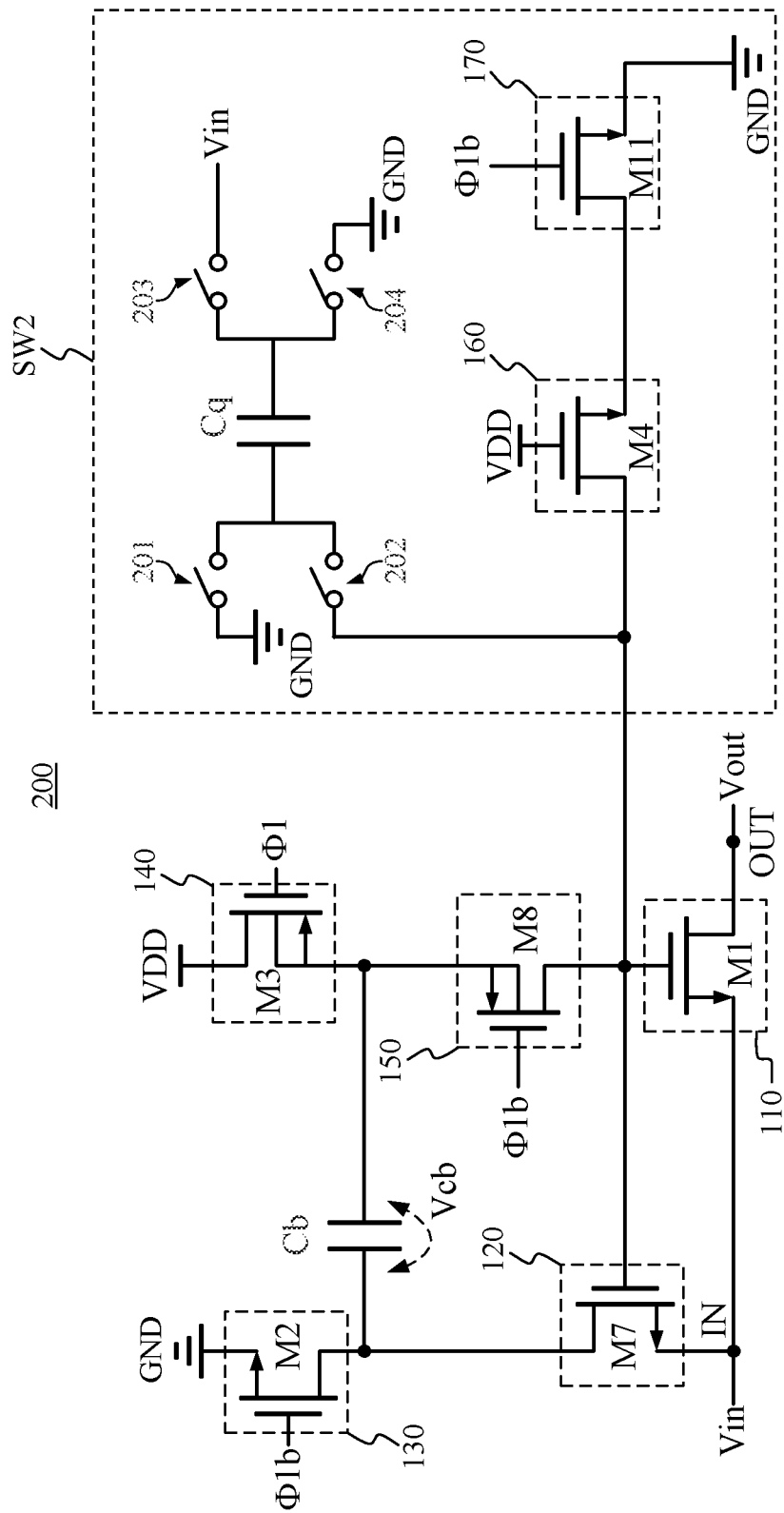
FIG. 4 is a circuit diagram of a bootstrapped switch according to another embodiment of the present invention.

FIG. 4 is a circuit diagram of a bootstrapped switch according to another embodiment of the present invention. The bootstrapped switch 200 is similar to the bootstrapped switch 100, except that the switch circuit SW1 of FIG. 2 is replaced by the switch circuit SW2 of FIG. 4. Similarly, the switch circuit SW2 corresponds to the switch 105 of FIG. 1. One of the characteristics of the bootstrapped switch is that when the bootstrapped switch is turned on, the voltage at the control terminal of the transistor M1 is a sum of the input voltage Vin and a DC voltage (e.g., the power supply voltage VDD). However, the composition of the input voltage Vin prevents the transistor M1 from being turned off rapidly.

The switch circuit SW2 includes a capacitor Cq, a switch 201, a switch 202, a switch 203, and a switch 204. The first terminal of the capacitor Cq is coupled to the ground level GND through the switch 201 as well as coupled or electrically connected to the control terminal of the transistor M1 through the switch 202; the second terminal of the capacitor Cq is coupled to the ground level GND through the switch 204 as well as receives the input voltage Vin through the switch 203 (which is equivalent to being coupled or electrically connected to the input terminal IN through the switch 203).

When the clock Φ1 is at the high level, the switch 201 and the switch 203 are turned on while the switch 202 and the switch 204 are turned off, so that the capacitor Cq is charging. After the charging is completed (i.e., the clock Φ1 becomes the low level), the voltage across the capacitor Cq is ideally equal to the input voltage Vin.

When the clock Φ1 is at the low level, the switch 201 and the switch 203 are turned off while the switch 202 and the switch 204 are turned on. As a result, the inverse of the voltage across the capacitor Cq is applied to the control terminal of the transistor M1 (which is equivalent to adding −Vin to the control terminal of the transistor M1) to offset the input voltage Vin at the control terminal of the transistor M1, which is helpful in the rapid fall of the voltage at the control terminal of the transistor M1 (i.e., helpful in the rapid turn-off of the transistor M1, which is equivalent to increasing the turn-off speed of the bootstrapped switch 100).

Figure 5:
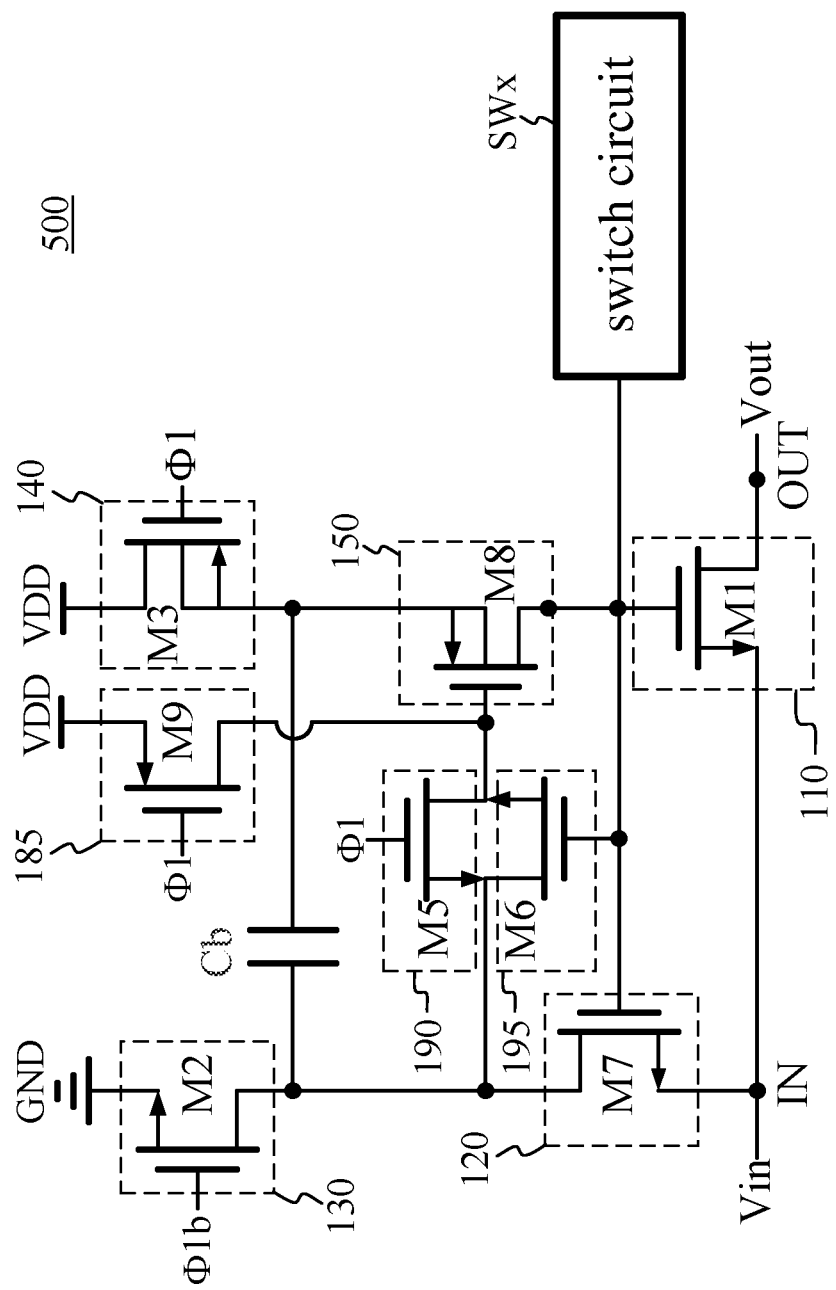
FIG. 5 is a circuit diagram of a bootstrapped switch according to another embodiment of the present invention.

FIG. 5 is a circuit diagram of a bootstrapped switch according to another embodiment of the present invention. The bootstrapped switch 500 includes a switch circuit SWx, a switch 185, a switch 190, and a switch 195. The switch 185, the switch 190, and the switch 195 are embodied by the transistor M9, the transistor M5, and the transistor M6, respectively. The switch 185 is coupled between the second reference voltage and the control terminal of the transistor M8, and is controlled by the clock Φ1. The switch 190 is coupled between the first terminal of the bootstrap capacitor Cb and the control terminal of the transistor M8, and is controlled by the clock Φ1. The switch 195 is coupled between the first terminal of the bootstrap capacitor Cb and the control terminal of the transistor M8, and the control terminal of the transistor M6 is electrically connected to the control terminal of the transistor M1 and the control terminal of the transistor M7. The transistor M5, the transistor M6, and the transistor M9 can provide overvoltage protection during the operation of the bootstrapped switch 500 to prolong the service life of the components. The operating principals of the transistor M5, the transistor M6, and the transistor M9 can be understood by people having ordinary skill in the art and are thus omitted for brevity. People having ordinary skill in the art can replace the switch circuit SWx of FIG. 5 with the switch circuit SW1 of FIG. 2 or the switch circuit SW2 of FIG. 4 according to the above discussions.

In other embodiments, the PMOS transistors and the NMOS transistors in the foregoing embodiments may be replaced by the NMOS transistors and PMOS transistors, respectively. People having ordinary skill in the art know how to implement the embodiments discussed above by adjusting the phase or level of the clock Φ1 and the clock Φ1b accordingly and adjusting the first reference voltage and the second reference voltage accordingly.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A bootstrapped switch that receives an input voltage and outputs an output voltage, comprising:
   a first transistor having a first terminal, a second terminal, and a first control terminal, wherein the first transistor receives the input voltage at the first terminal and outputs the output voltage at the second terminal;
   a first capacitor having a third terminal and a fourth terminal;
   a second transistor having a fifth terminal, a sixth terminal, and a second control terminal, wherein the second transistor receives the input voltage at the fifth terminal, the sixth terminal is electrically connected to the third terminal of the first capacitor, and the second control terminal is electrically connected to the first control terminal of the first transistor;
   a first switch coupled between the third terminal of the first capacitor and a first reference voltage;
   a second switch coupled between the fourth terminal of the first capacitor and a second reference voltage;
   a third switch coupled between the fourth terminal of the first capacitor and the first control terminal of the first transistor;
   a fourth switch having a third control terminal and coupled to the first reference voltage;
   a fifth switch coupled between the first control terminal of the first transistor and the fourth switch;
   a sixth switch;
   a seventh switch;
   an eighth switch;
   a ninth switch; and
   a second capacitor having a seventh terminal and an eighth terminal, wherein the seventh terminal is coupled to the first reference voltage through the sixth switch and coupled to the first control terminal through the seventh switch, and the eighth terminal receives the input voltage through the eighth switch and is coupled to the first reference voltage through the ninth switch;
   wherein the sixth switch and the seventh switch are not turned on at the same time, and the eighth switch and the ninth switch are not turned on at the same time.

2. The bootstrapped switch of claim 1, wherein in a first clock phase, the first switch, the second switch, the fourth switch, and the fifth switch are turned on and the third switch is turned off to charge the first capacitor; in a second clock phase, the third switch is turned on, and the first switch, the second switch, the fourth switch, and the fifth switch are turned off.

3. The bootstrapped switch of claim 2, wherein the seventh switch and the ninth switch are turned on in the first clock phase, and the sixth switch and the eighth switch are turned on in the second clock phase.

4. The bootstrapped switch of claim 2, wherein the third control terminal of the fourth switch receives a clock, and the clock is at a high level in the first clock phase.

5. The bootstrapped switch of claim 4, wherein the clock is at a low level in the second clock phase.

6. The bootstrapped switch of claim 1, wherein the fifth switch has a fourth control terminal, and the fourth control terminal is electrically connected to the second reference voltage.

* * * * *